(12) United States Patent
Takagi

(10) Patent No.: US 9,947,628 B2
(45) Date of Patent: Apr. 17, 2018

(54) HIGH FREQUENCY SEMICONDUCTOR AMPLIFIER

(71) Applicant: Kabushiki Kaisha Toshiba, Minato-ku (JP)

(72) Inventor: Kazutaka Takagi, Kawasaki (JP)

(73) Assignee: Kabushiki Kaisha Toshiba, Minato-ku (JP)

(*) Notice: Subject to any disclaimer, the term of this patent is extended or adjusted under 35 U.S.C. 154(b) by 0 days.

(21) Appl. No.: 15/239,923

(22) Filed: Aug. 18, 2016

(65) Prior Publication Data
US 2017/0162525 A1 Jun. 8, 2017

(30) Foreign Application Priority Data
Dec. 3, 2015 (JP) .................................. 2015-236804

(51) Int. Cl.
*H01L 23/66* (2006.01)
*H03F 3/195* (2006.01)
(Continued)

(52) U.S. Cl.
CPC ............ *H01L 23/66* (2013.01); *H01L 25/072* (2013.01); *H01L 25/16* (2013.01); *H01L 25/162* (2013.01);
(Continued)

(58) Field of Classification Search
CPC ............ H01L 23/66; H01L 2223/6611; H01L 2223/6644–2223/6672; H01L 2223/6683;
(Continued)

(56) References Cited

U.S. PATENT DOCUMENTS 5,742,206 A * 4/1998 Ishida .................... H03G 1/007
330/145
6,330,165 B1 * 12/2001 Kohjiro ................... H01L 23/04
174/250
(Continued)

FOREIGN PATENT DOCUMENTS

JP 62-39908 A 2/1987
JP 4-321308 11/1992
(Continued)

OTHER PUBLICATIONS

U.S. Appl. No. 15/040,488, filed Feb. 10, 2016, Kenta Kuroda, et al.

*Primary Examiner* — Jeremy Joy
(74) *Attorney, Agent, or Firm* — Oblon, McClelland, Maier & Neustadt, L.L.P.

(57) ABSTRACT

A high frequency semiconductor amplifier includes an input circuit, a first semiconductor element, first bonding wires, an interstage circuit, second bonding wires, a second semiconductor element, third bonding wires, an output circuit, fourth bonding wires and a package. The input circuit includes a first DC blocking capacitor, an input transmission line, a first input pad part, and a first bias circuit. The interstage circuit includes a second DC blocking capacitor, an interstage transmission line, a first output pad part, and a second bias circuit, a microstrip line divider, and a second input pad part. The output circuit includes a second output pad part, a microstrip line combiner, a third DC blocking capacitor, an output transmission line, and a fourth bias circuit. The first and second semiconductor elements, the input circuit, the interstage circuit, and the output circuit are bonded to the package.

8 Claims, 10 Drawing Sheets

(51) Int. Cl.
*H01L 29/16* (2006.01)
*H01L 25/07* (2006.01)
*H01L 25/16* (2006.01)

(52) U.S. Cl.
CPC ...... *H01L 29/1602* (2013.01); *H01L 29/1608* (2013.01); *H03F 3/195* (2013.01); *H01L 2223/66* (2013.01); *H01L 2223/6611* (2013.01); *H01L 2223/6644* (2013.01); *H01L 2223/6683* (2013.01); *H01L 2224/40* (2013.01); *H01L 2224/49175* (2013.01)

(58) Field of Classification Search
CPC .... H03F 3/195; H03F 3/21–3/211; H03F 3/19
See application file for complete search history.

(56) References Cited

U.S. PATENT DOCUMENTS

| | | | | |
|---|---|---|---|---|
| 7,095,293 | B2* | 8/2006 | Buer | H01L 23/50 333/32 |
| 7,741,907 | B2* | 6/2010 | Takagi | H03F 3/217 330/251 |
| 7,990,223 | B1* | 8/2011 | Takagi | H01L 23/66 330/296 |
| 8,102,036 | B2* | 1/2012 | Kashiwabara | H01L 23/64 257/664 |
| 8,610,507 | B2 | 12/2013 | Ng et al. | |
| 9,065,391 | B1* | 6/2015 | Komiak | H03F 3/191 |
| 9,508,658 | B1* | 11/2016 | Convert | H01L 23/552 |
| 9,647,656 | B2* | 5/2017 | Masuda | H03K 17/16 |
| 2002/0039038 | A1* | 4/2002 | Miyazawa | H01L 23/66 327/113 |
| 2004/0000676 | A1* | 1/2004 | Fujioka | H01L 21/823425 257/198 |
| 2005/0104664 | A1* | 5/2005 | Donig | H03F 1/0261 330/310 |
| 2005/0236689 | A1* | 10/2005 | Sugiura | H01L 23/49838 257/531 |
| 2006/0103470 | A1* | 5/2006 | Kato | H01L 23/66 330/307 |
| 2007/0194852 | A1* | 8/2007 | Tsuromaki | H03F 1/302 330/285 |
| 2007/0268073 | A1* | 11/2007 | Suzaki | H03F 1/56 330/295 |
| 2009/0039966 | A1* | 2/2009 | Chow | H01L 23/66 330/307 |
| 2010/0091477 | A1* | 4/2010 | Takagi | H01L 23/057 361/820 |
| 2011/0204976 | A1* | 8/2011 | Masuda | H01L 23/047 330/195 |
| 2012/0037969 | A1* | 2/2012 | Sanders | H01L 23/481 257/296 |
| 2012/0234592 | A1* | 9/2012 | Takagi | H01L 23/047 174/266 |
| 2012/0268211 | A1* | 10/2012 | Ng | H03F 1/56 330/277 |
| 2013/0105205 | A1* | 5/2013 | Takagi | H01L 23/10 174/257 |
| 2015/0162877 | A1* | 6/2015 | Ni | H03F 3/21 330/296 |
| 2015/0200660 | A1* | 7/2015 | Masuda | H03K 17/16 327/379 |
| 2015/0280697 | A1* | 10/2015 | Takagi | H03K 5/1252 327/551 |
| 2016/0099684 | A1* | 4/2016 | Qiu | H03F 1/0205 330/307 |
| 2016/0197584 | A1* | 7/2016 | Tanimoto | H03F 1/0288 455/114.3 |
| 2016/0261236 | A1* | 9/2016 | Kuroda | H01L 23/66 |

FOREIGN PATENT DOCUMENTS

| | | |
|---|---|---|
| JP | 5-75314 A | 3/1993 |
| JP | 5-283954 A | 10/1993 |
| JP | 2006-20206 A | 1/2006 |
| JP | 2011-29966 A | 2/2011 |
| JP | 2011-250361 A | 12/2011 |
| JP | 2014-203846 A | 10/2014 |
| TW | I371135 B | 8/2012 |
| TW | I457982 B | 10/2014 |
| TW | I471986 B | 2/2015 |
| TW | I482280 B | 4/2015 |
| WO | WO 2013/175690 A1 | 11/2013 |

* cited by examiner

HIGH FREQUENCY SEMICONDUCTOR AMPLIFIER

CROSS-REFERENCE TO RELATED APPLICATIONS

This application is based upon and claims the benefit of priority from Japanese Patent Application No. 2015-236804, filed on Dec. 3, 2015; the entire contents of which are incorporated herein by reference.

FIELD

Embodiments described herein relate generally a high frequency semiconductor amplifier.

BACKGROUND

Use of MMIC (microwave monolithic integrated circuit) amplifiers facilitates miniaturization of radar devices and communication equipment.

An MMIC amplifier can be implemented by using e.g. a wafer in which a nitride-based semiconductor layer is provided on a SiC or Si substrate.

However, MMIC provided in a nitride-based semiconductor layer formed on a SiC substrate (AlGaN/GaN/SiC) has low capacitor breakdown voltages and is expensive. MMIC provided in a nitride-based semiconductor layer formed on a Si substrate (AlGaN/GaN/Si) is insufficient in heat dissipation performance for heat generated from the semiconductor element.

DETAILED DESCRIPTION

Figure 1A:
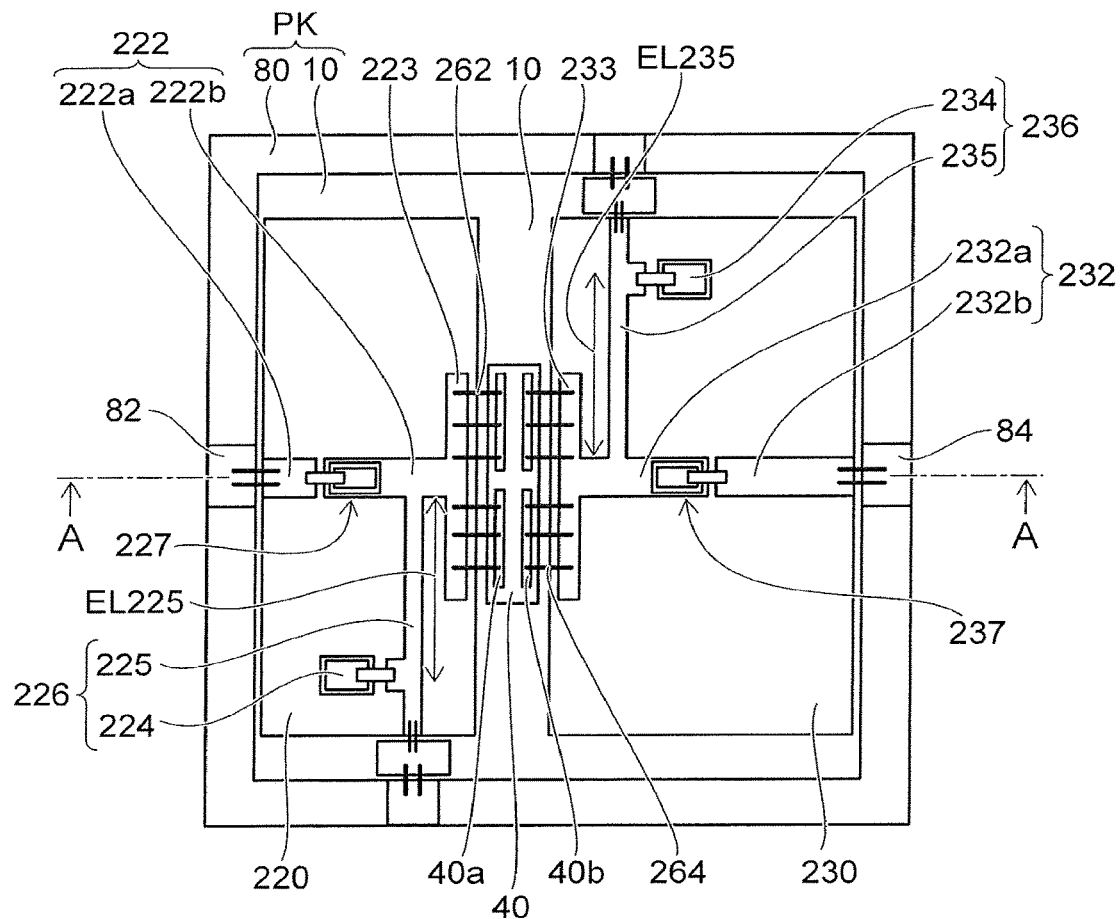
FIG. 1A is a schematic plan view of a high frequency amplifying semiconductor device according to a first embodiment.

In general, according to one embodiment, a high frequency semiconductor amplifier includes an input circuit, a first semiconductor element, first bonding wires, an interstage circuit, second bonding wires, a second semiconductor element, third bonding wires, an output circuit, fourth bonding wires and a package. The input circuit is provided on a Si substrate and includes a first DC blocking capacitor, an input transmission line having two regions connected to respective ends of the first DC blocking capacitor, a first input pad part connected to the input transmission line, and a first bias circuit. The first semiconductor element includes a nitride-based semiconductor layer. The first bonding wires connect the first input pad part and the first semiconductor element. The interstage circuit is provided on a Si substrate and includes a second DC blocking capacitor, an interstage transmission line having two regions connected to respective ends of the second DC blocking capacitor, a first output pad part connected to the interstage transmission line, and a second bias circuit, a microstrip line divider connected to the interstage transmission line, a third bias circuit, and a second input pad part connected to the microstrip line divider. The second bonding wires connect the first semiconductor element and the output pad part. The second semiconductor element includes a nitride-based semiconductor layer. The third bonding wires connect the second input pad part and the second semiconductor element. The output circuit is provided on a Si substrate and includes a second output pad part, a microstrip line combiner connected to the second output pad part, a third DC blocking capacitor, an output transmission line connected to an output end of the microstrip line combiner and having two regions connected to respective ends of the third DC blocking capacitor, and a fourth bias circuit. The fourth bonding wires connect the second output pad part and the second semiconductor element. The first and second semiconductor elements, the input circuit, the interstage circuit, and the output circuit are bonded to the package. The first bias circuit includes a first grounded capacitor and a first transmission line connected to the first grounded capacitor and a region of the input transmission line between the input pad part and the first DC blocking capacitor. The second bias circuit includes a second grounded capacitor and a second transmission line connected to the second grounded capacitor and a region of the interstage transmission line between the output pad part and the second DC blocking capacitor. The third bias circuit includes a third grounded capacitor and a third transmission line connected to the microstrip line divider and the third grounded capacitor. The fourth bias circuit includes a fourth grounded capacitor and a fourth transmission line connected to the microstrip line combiner and the fourth grounded capacitor. The first to fourth grounded capacitors and the first to third DC blocking capacitors have a first dielectric layer including Si oxide film or Si nitride film and sandwiched between upper and lower metal films. The first to fourth grounded capacitors and the first to third DC blocking capacitors are provided on a surface of the Si substrate.

Embodiments of the invention will now be described with reference to the drawings.

Figure 1B:
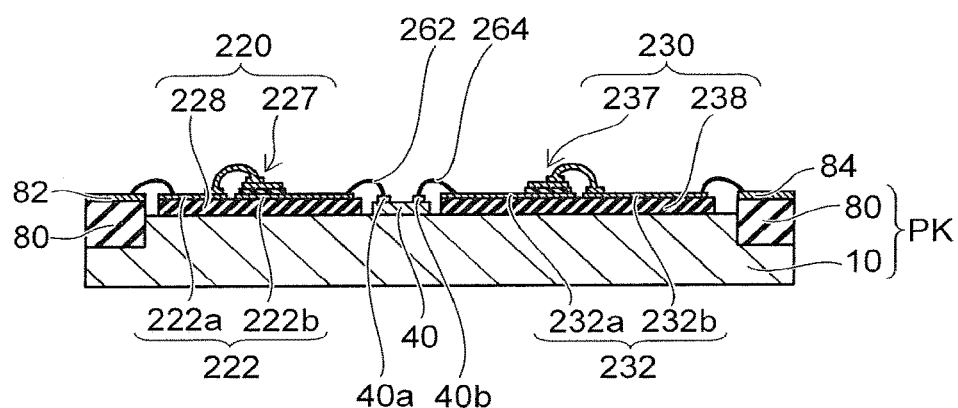
FIG. 1B is a schematic sectional view taken along line A-A thereof.

FIG. 1A is a schematic plan view of a high frequency amplifying semiconductor device according to a first embodiment. FIG. 1B is a schematic sectional view taken along line A-A thereof.

The high frequency semiconductor amplifier includes a package PK made of a metal plate 10 and a frame part 80, an input circuit 220, a semiconductor element 40, first bonding wires 262, an output circuit 230, and second bonding wires 264.

The input circuit 220 includes an input transmission line 222 having a first region 222a and a second region 222b spaced from each other, an input pad part 223 connected to the second region 222b, a first DC blocking capacitor 227 connected between the first region 222a and the second region 222b, and a first bias circuit 226. The input circuit 220 is provided on a Si substrate 228. The input bias circuit 226 includes a first grounded capacitor 224 and a first transmission line 225. The first transmission line 225 has one end part connected to the second region 222b and the other end part connected to the first grounded capacitor 224. The impedance at the fundamental of the input bias circuit 226 as viewed from the input transmission line 222 side can be made high by setting the electrical length EL225 of the first transmission line 225 to approximately a quarter wavelength (81°-99°) of the fundamental wave.

The output circuit 230 includes an output pad part 233, an output transmission line 232 having a first region 232a connected to the output pad part 233 and a second region 232b, a second DC blocking capacitor 237 connected between the first region 232a and the second region 232b of the output transmission line 232, and an output bias circuit 236. The output circuit 230 is provided on a Si substrate 238. The output bias circuit 236 includes a second grounded capacitor 234 and a second transmission line 235. The second transmission line 235 has one end part connected to the first region 232a of the output transmission line 232 and the other end part connected to the second grounded capacitor 234.

The first bonding wires 262 connect the input pad part 223 and an input electrode 40a of the semiconductor element 40. The second bonding wires 264 connect an output electrode 40b of the semiconductor element 40 and the output pad part 233. The impedance at the fundamental of the output bias circuit 236 as viewed from the output transmission line 232 side can be made high by setting the electrical length EL235 of the second transmission line 235 to approximately a quarter wavelength (81°-99°) of the fundamental wave.

The first and second grounded capacitors 224, 234 and the first and second DC blocking capacitor 227, 237 are made of a dielectric layer 94 such as a Si oxide film or Si nitride film sandwiched between upper and lower metal films, and are provided on the surface of the Si substrates 228, 238, respectively.

The package PK includes a metal plate 10 and a frame part 80 provided on the peripheral part of the metal plate 10. The frame part 80 includes e.g. an input terminal 82 and an output terminal 84 on its surface. The surface of the frame part 80 may be further provided with a terminal for connection to the bias circuit. The inside of the package can be hermetically sealed by sealing the surface of the frame part 80 with a lid part (not shown).

The frame part 80 can be made of ceramics such as alumina ($Al_2O_3$) and aluminum nitride (AlN). The metal plate 10 can be made of e.g. CuW or CuMo. The frame part 80 and the metal plate 10 are bonded by e.g. silver brazing.

A chip capacitor can be provided between the frame part 80 and the input circuit 220 and between the frame part 80 and the output circuit 230. The capacitance of the chip capacitor may be set to e.g. 100 pF. The upper electrode thereof may be connected to the end part of the transmission line constituting the bias circuit with e.g. bonding wires. This can reduce e.g. power supply noise.

Figure 2A:
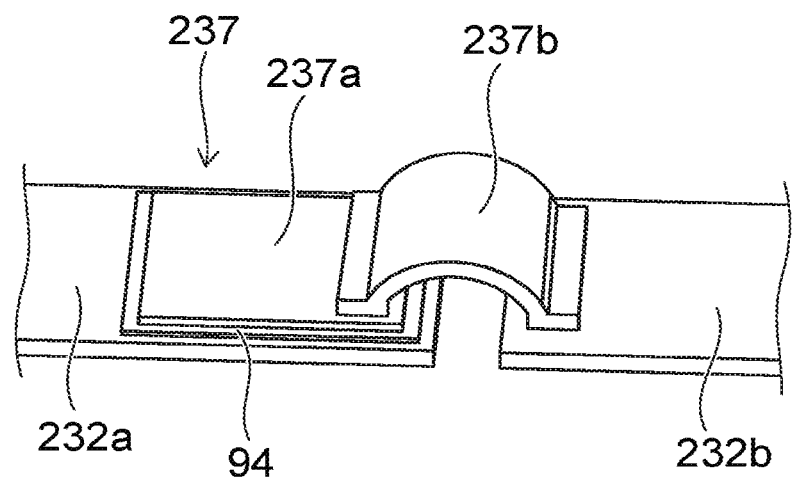
FIG. 2A is a schematic perspective view of the DC blocking capacitor.
Figure 2B:
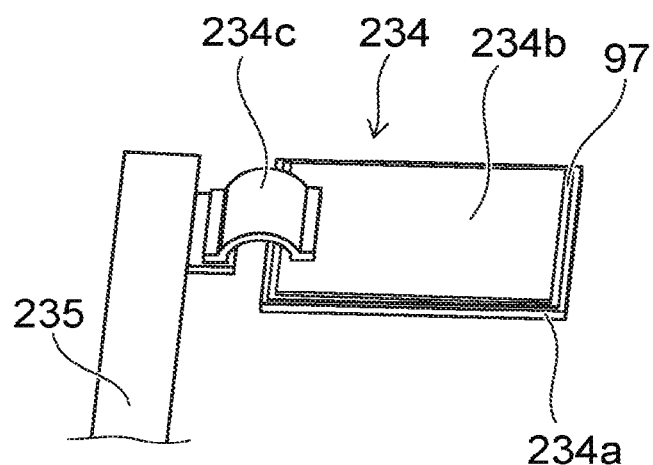
FIG. 2B is a schematic perspective view of the grounded capacitor.

FIG. 2A is a schematic perspective view of the DC blocking capacitor. FIG. 2B is a schematic perspective view of the grounded capacitor.

As shown in FIG. 2A, for instance, the second DC blocking capacitor 237 is provided in the gap between the first region 232a and the second region 232b of the output transmission line 232. The dielectric layer 94 is provided on the first region 232a. An upper electrode 237a is provided on the dielectric layer 94. A connection conductor 237b made of e.g. an air bridge is connected to each of the upper electrode 237a and the second region 232b of the output transmission line 232. The structure of the DC blocking capacitor is not limited to FIG. 2A.

As shown in FIG. 2B, the second grounded capacitor 234 includes a lower electrode 234a, a dielectric layer 97 provided on the lower electrode 234a, an upper electrode 234b provided on the dielectric layer 97, and a connection conductor 234c made of e.g. an air bridge. The connection conductor 234c is connected to an end part of the second transmission line 235 and the upper electrode 234b. The lower electrode 234a is connected to the metal plate 10 (ground) through e.g. a through hole (not shown) provided in the Si substrate 28, 38. The structure of the grounded capacitor is not limited to FIG. 2B. The dielectric layers 94, 97 are referred to as first dielectric layers. The first dielectric layers 94, 97 may be formed by the same process, or may be formed in different thickness and different material by separate processes.

The circuit portion does not involve large heat generation. Thus, the circuit portion does not need to be provided on an expensive wafer such as a SiC substrate and diamond substrate for heat dissipation. When the input circuit 220 and the output circuit 230 are provided on the Si substrate 28, 38, the circuit portion requiring a large area can be made of an inexpensive Si substrate, achieving low cost. Furthermore, when the input circuit 220 and the output circuit 230 are provided on the Si substrate 28, 38, the grounded capacitor and the DC blocking capacitor constituting the bias circuit can be formed using the semiconductor manufacturing process. This can increase the capacitor breakdown voltage.

The semiconductor element 40 can be e.g. a field effect transistor such as HEMT (high electron mobility transistor). The field effect transistor includes a nitride-based semiconductor layer provided on a SiC substrate or diamond substrate. Forming a nitride-based semiconductor layer on a Si substrate can reduce the cost of the wafer. However, undesirably, this degrades heat dissipation performance, and hence the characteristics and reliability of the semiconductor element 40, compared with the SiC substrate or diamond substrate. High heat dissipation performance can be made compatible with low cost by providing only the HEMT portion generating heat with high density on a wafer made of nitride-based semiconductor provided on the SiC substrate or diamond substrate.

The field effect transistor is made of a plurality of cell regions in which the current is controlled by a multi-finger electrode. Each cell region is provided with finger electrodes including a finger gate electrode, a finger drain electrode, and a finger source electrode. The finger gate electrodes are bundled and connected to a gate terminal electrode. The finger drain electrodes are bundled and connected to a drain terminal electrode. The finger source electrodes are bundled and connected to the ground.

Figure 3A:
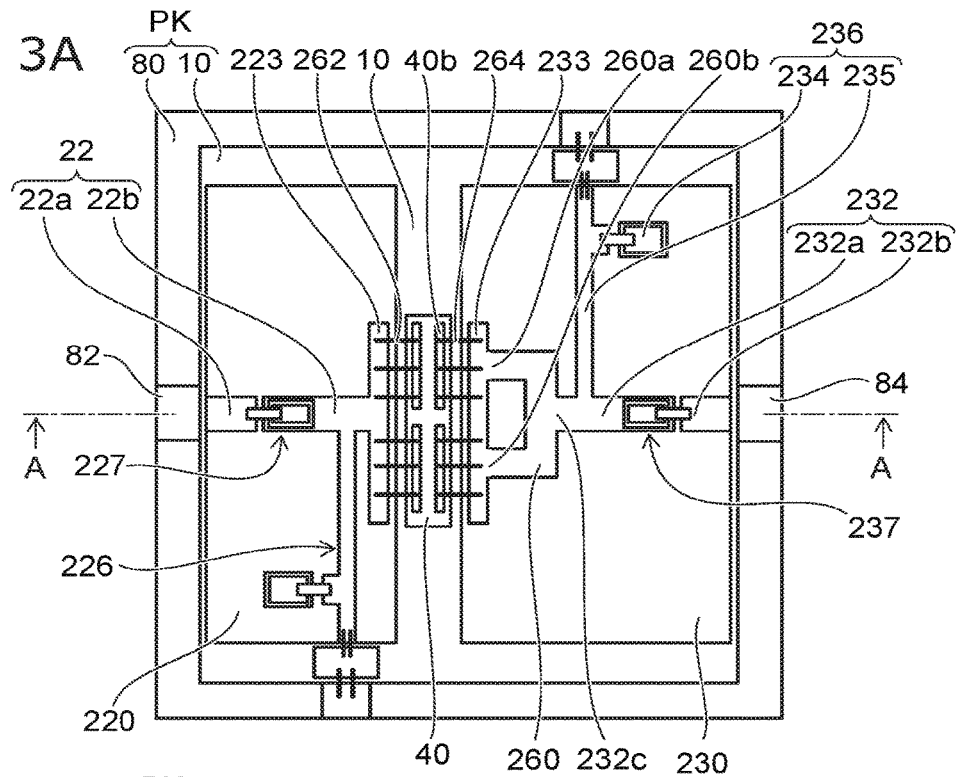
FIG. 3A is a schematic plan view of a high frequency semiconductor amplifier according to a first variation of the first embodiment.
Figure 3B:
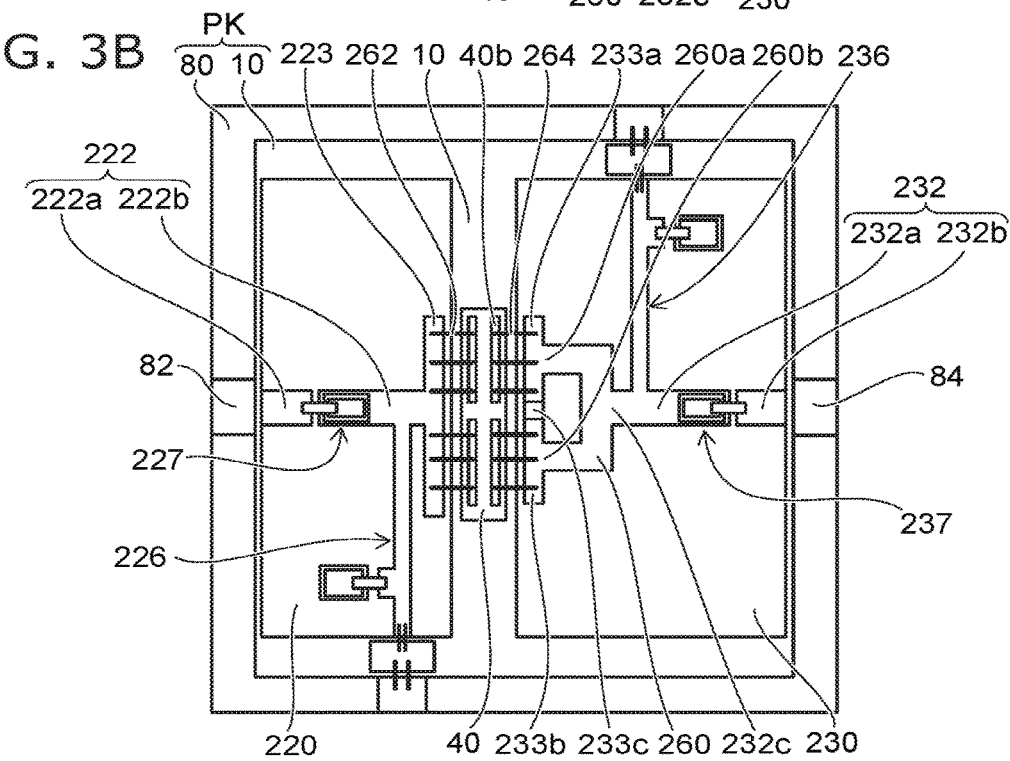
FIG. 3B is a schematic plan view of a high frequency semiconductor amplifier according to a second variation of the first embodiment.

FIG. 3A is a schematic plan view of a high frequency semiconductor amplifier according to a first variation of the first embodiment. FIG. 3B is a schematic plan view of a high frequency semiconductor amplifier according to a second variation of the first embodiment.

The output circuit 230 can further include a microstrip line combiner 260 having a prescribed characteristic impedance and a prescribed electrical length. The microstrip line combiner 260 also functions as an impedance conversion circuit.

When the semiconductor element 40 has a multi-cell structure, the output electrode (e.g., drain electrode) 40b is elongated along the cell arrangement direction. With the elongation of the output pad part 233 of the output circuit 230, the distance from the end part 232c of the output transmission line 232 to the cell is made non-uniform. As shown in FIG. 3A, preferably, the connection positions of two end parts 260a, 260b of the microstrip line combiner 260 to the output pad part 233 are symmetric along line A-A. Furthermore, preferably, the plurality of cells are connected so as to operate uniformly.

The impedance of the output bias circuit 236 as viewed from the output transmission line 232 can be made high by setting the electrical length of the second transmission line 235 constituting the output bias circuit 236 to a quarter wavelength (e.g., 81° or more and 99° or less).

As shown in FIG. 3B, the output pad part 233 may be bisected. The output electrode 40b of the semiconductor element 40 is bisected. The output pad part 233 is also bisected (233a, 233b) correspondingly. Furthermore, the center of the output pad part 233a is connected to the end part 60a of the microstrip line combiner 260. The center of the output pad part 233b is connected to the end part 260b of the microstrip line combiner 260. This makes the operation uniform between the cells. An isolation resistor 233c may be provided between the divided output pad parts 233a and 233b. This can avoid loop oscillation. The isolation resistor 233c can be made of Si bulk or metal thin film, which can be formed by the Si semiconductor manufacturing process.

The input circuit 220 can further include e.g. a microstrip line divider having a prescribed characteristic impedance and a prescribed electrical length. The microstrip line divider also functions as an impedance conversion circuit.

Figure 4:
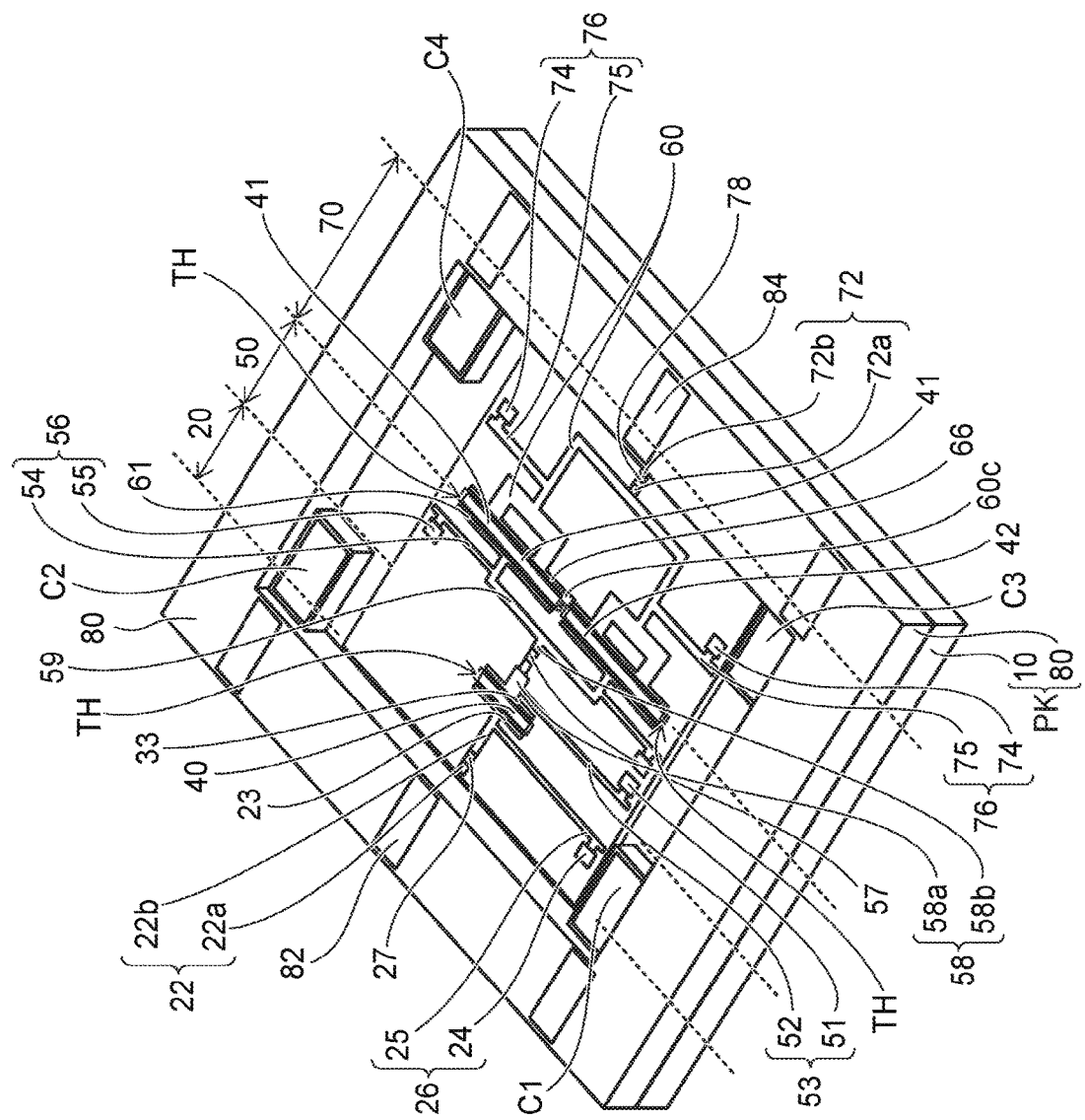
FIG. 4 is a schematic perspective view of a high frequency semiconductor amplifier according to a second embodiment.

FIG. 4 is a schematic perspective view of a high frequency semiconductor amplifier according to a second embodiment.

Figure 5:
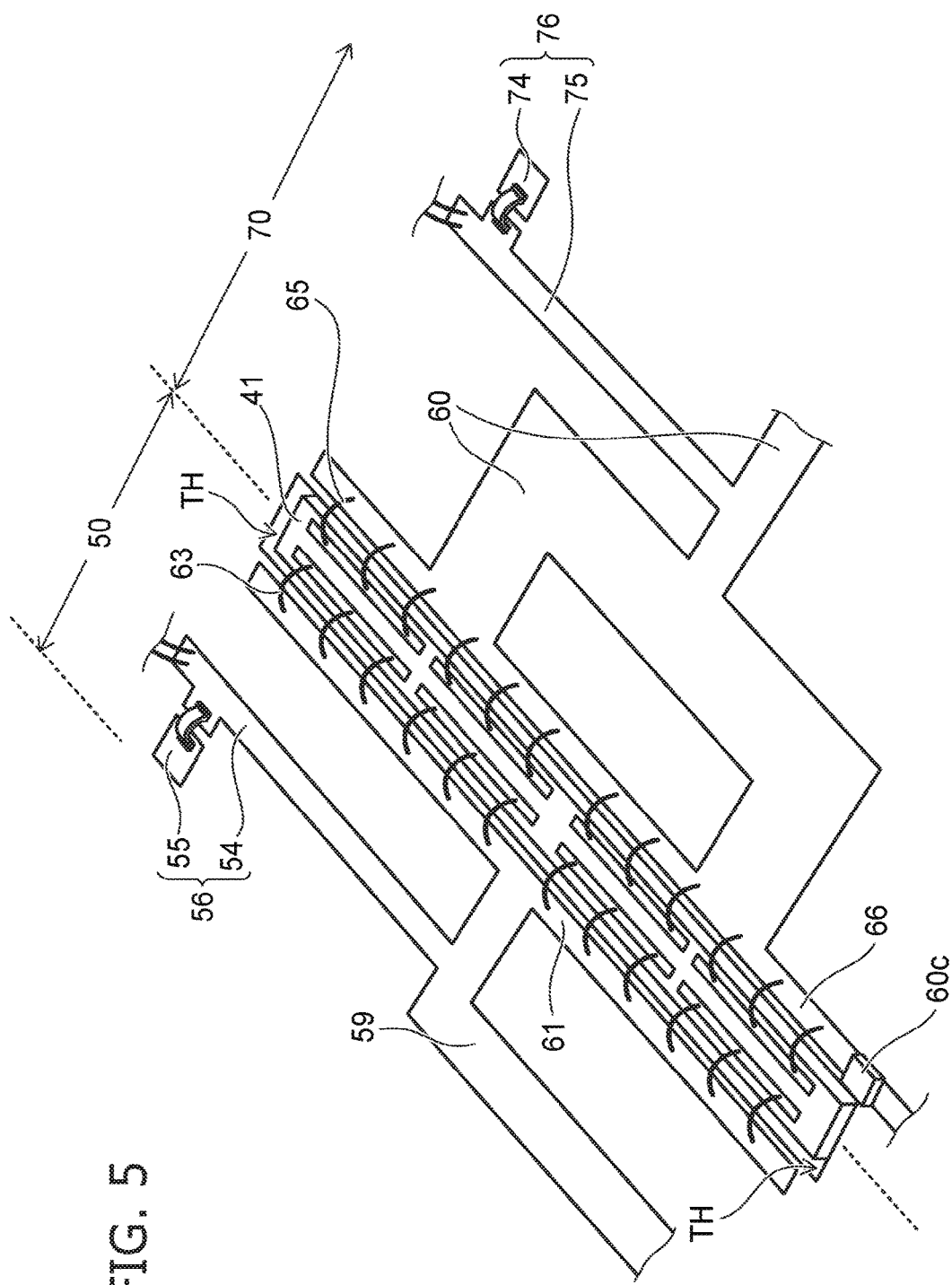
FIG. 5 is a partially enlarged schematic perspective view of a neighborhood of a second semiconductor element of the high frequency semiconductor amplifier according to the second embodiment.

FIG. 5 is a partially enlarged schematic perspective view of a neighborhood of a second semiconductor element of the high frequency semiconductor amplifier according to the second embodiment.

While the first embodiment relates to a one-stage amplifier, the second embodiment relates to a multi-stage amplifier. In the first embodiment, the circuit portion is formed on a plurality of Si substrates. In the second embodiment, through holes TH enough to house a semiconductor element are opened in one Si substrate, and circuits are formed therearound to facilitate assembly of the multi-stage amplifier.

The high frequency semiconductor amplifier includes a package PK made of a metal plate 10 and a frame part 80, an input circuit 20, a first semiconductor element 40, first bonding wires, an interstage circuit 50, second bonding wires, second semiconductor elements 41, 42, third bonding wires 63 (FIG. 5), an output circuit 70, and fourth bonding wires 65 (FIG. 5). The bonding wires are not shown in FIG. 4. As an example, FIG. 5 shows the second semiconductor element 41, and the third and fourth bonding wires 63, 65 connecting the circuit.

The input circuit 20 includes a first DC blocking capacitor 27, an input transmission line 22 having two regions 22a, 22b connected to the respective ends of the first DC blocking capacitor 27, a first input pad part 23 connected to the region 22b of the input transmission line 22, and a first bias circuit 26. The input circuit 20 is provided on a Si substrate.

The first semiconductor element 40 includes a nitride-based semiconductor layer provided on a SiC substrate or diamond substrate. The first semiconductor element 40 is provided on the metal plate 10. The first bonding wire connects the first input pad part 23 and the first semiconductor element 40.

The interstage circuit 50 includes a second DC blocking capacitor 57, an interstage transmission line 58 having two regions 58a, 58b connected to the respective ends of the second DC blocking capacitor 57, a first output pad part 33 connected to one region 58a of the interstage transmission line 58, a second bias circuit 53, a microstrip line divider 59 connected to the other region 58b of the interstage transmission line 58, a third bias circuit 56, and a second input pad part 61 connected to the microstrip line divider 59. The interstage circuit 50 is provided on the Si substrate.

The second bonding wires connect the first semiconductor element 40 and the first output pad part 33 of the interstage circuit 50. The second semiconductor element 41, 42 includes a nitride-based semiconductor layer provided on a SiC substrate or diamond substrate. The second semiconductor element 41, 42 is provided on the metal plate 10. The third bonding wires 63 connect the second input pad part 61 connected to the microstrip line divider 59, and the second semiconductor elements 41, 42.

The output circuit 70 includes a second output pad part 66, a microstrip line combiner 60 connected to the second output pad part 66, a third DC blocking capacitor 78, an output transmission line 72 connected to the output end of the microstrip line combiner 60 and having two regions connected to the respective ends of the third DC blocking capacitor 78, and a fourth bias circuit 76. The output circuit 70 is provided on the Si substrate. The fourth bonding wires 65 connect the second output pad part 66 and the second semiconductor elements 41, 42. An isolation resistor 60c can be provided between the two regions of the second output pad part 66.

The input circuit 20, the interstage circuit 50, and the output circuit 70 are provided on a continuous Si substrate. The first semiconductor element 40 and the second semiconductor elements 41, 42 are each placed in a through hole TH provided in the Si substrate.

The first bias circuit 26 includes a first grounded capacitor 24 and a first transmission line 25. The first transmission line 25 is connected to the first grounded capacitor 24 and the region 22b of the input transmission line 22 between the first input pad part 23 and the first DC blocking capacitor 27.

The second bias circuit 53 includes a second grounded capacitor 51 and a second transmission line 52. The second transmission line 52 is connected to the second grounded capacitor 51 and the region 58a of the interstage transmission line 58 between the first output pad part 33 and the second DC blocking capacitor 57.

The third bias circuit 56 includes a third grounded capacitor 55 and a third transmission line 54 connected to the microstrip line divider 59 and the third grounded capacitor 55. The second input pad part 61 is connected to the microstrip line divider 59.

The fourth bias circuit 76 includes a fourth grounded capacitor 74 and a fourth transmission line 75 connected to the microstrip line combiner 60 and the fourth grounded capacitor 74. The second output pad part 66 is connected to the microstrip line combiner 60.

Capacitors C1-C4 are e.g. chip capacitors having a capacitance of 100 pF or more. In FIG. 5, the bonding wires connected to the end part of the third transmission line 54 and the end part of the fourth transmission line 75 are connected to the upper electrodes of the respective chip capacitors provided outside the Si substrate. This can reduce e.g. power supply noise.

The first to fourth grounded capacitors and the first to third DC blocking capacitors are made of a dielectric layer including a Si oxide film or Si nitride film sandwiched between upper and lower metal films, and are provided on the surface of the Si substrate.

Figure 6:
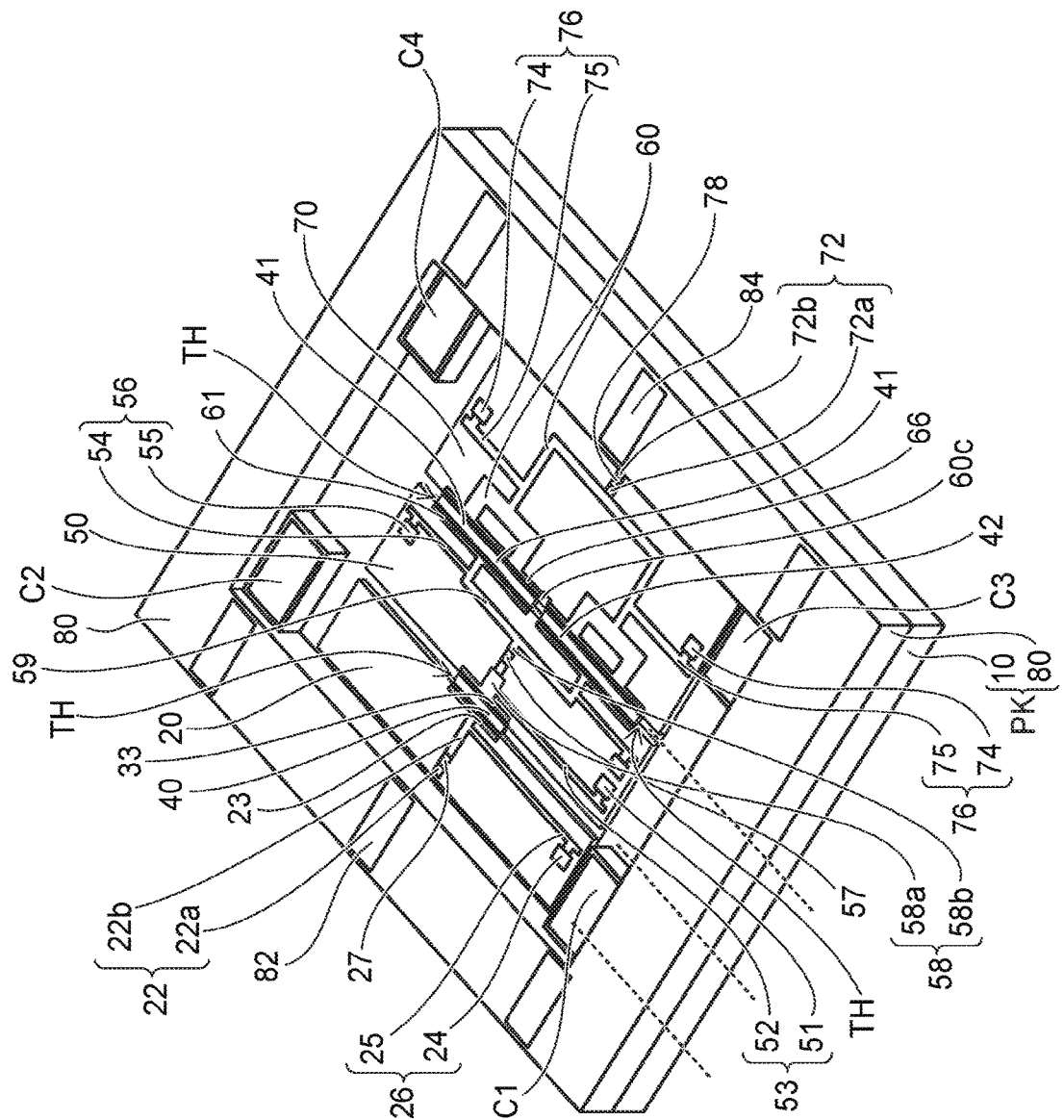
FIG. 6 is a schematic perspective view of a high frequency semiconductor amplifier according to a third embodiment.

FIG. 6 is a schematic perspective view of a high frequency semiconductor amplifier according to a third embodiment.

Figure 7:
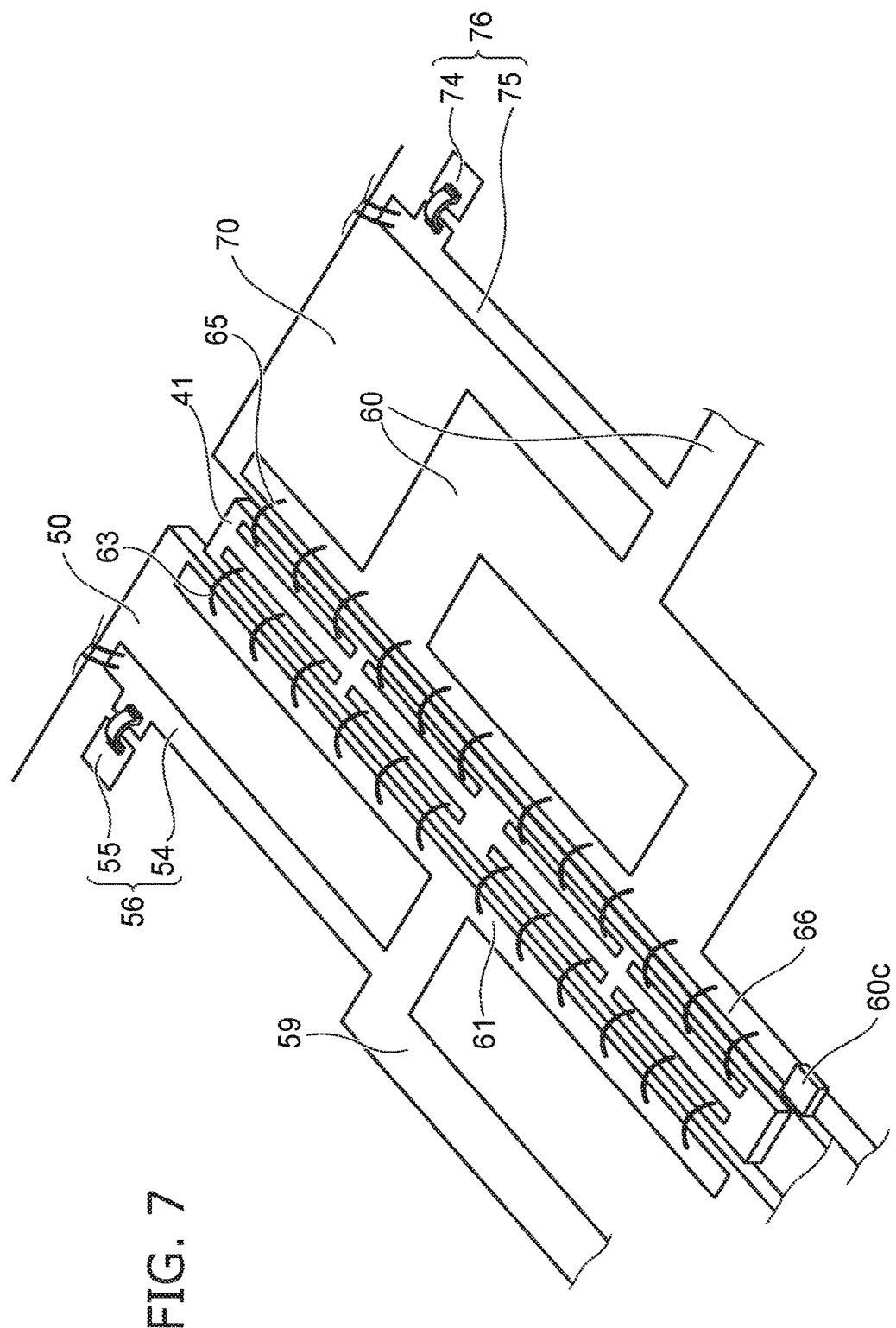
FIG. 7 is a partially enlarged schematic perspective view of a neighborhood of a second semiconductor element of the high frequency semiconductor amplifier according to the third embodiment.

FIG. 7 is a partially enlarged schematic perspective view of a neighborhood of a second semiconductor element of the high frequency semiconductor amplifier according to the third embodiment.

In the high frequency semiconductor amplifier according to the third embodiment, the input circuit 20, the interstage circuit 50, and the output circuit 70 are based on Si substrates separated from each other. The first semiconductor element 40 is placed between the Si substrate provided with the input circuit 20 and the Si substrate provided with the interstage circuit 50. The second semiconductor element 41 is placed between the Si substrate provided with the interstage circuit 50 and the Si substrate provided with the output circuit 70. In this structure, there is no need to provide a through hole in the Si substrate. An isolation resistor 60c can be provided between the two regions of the second output pad part 66.

Figure 8:
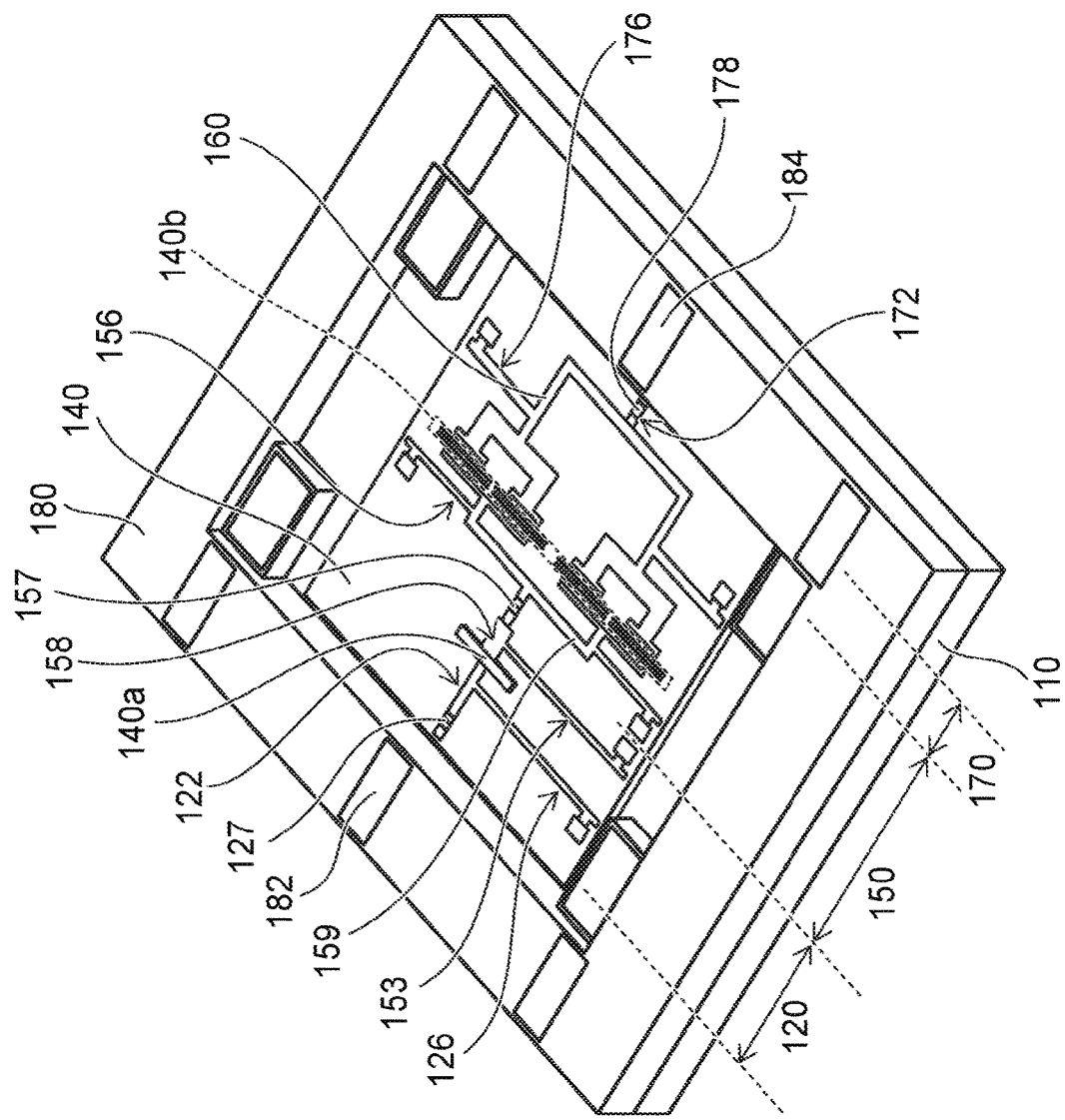
FIG. 8 is a schematic perspective view of a high frequency semiconductor amplifier according to a comparative example.

FIG. 8 is a schematic perspective view of a high frequency semiconductor amplifier according to a comparative example.

Figure 9:
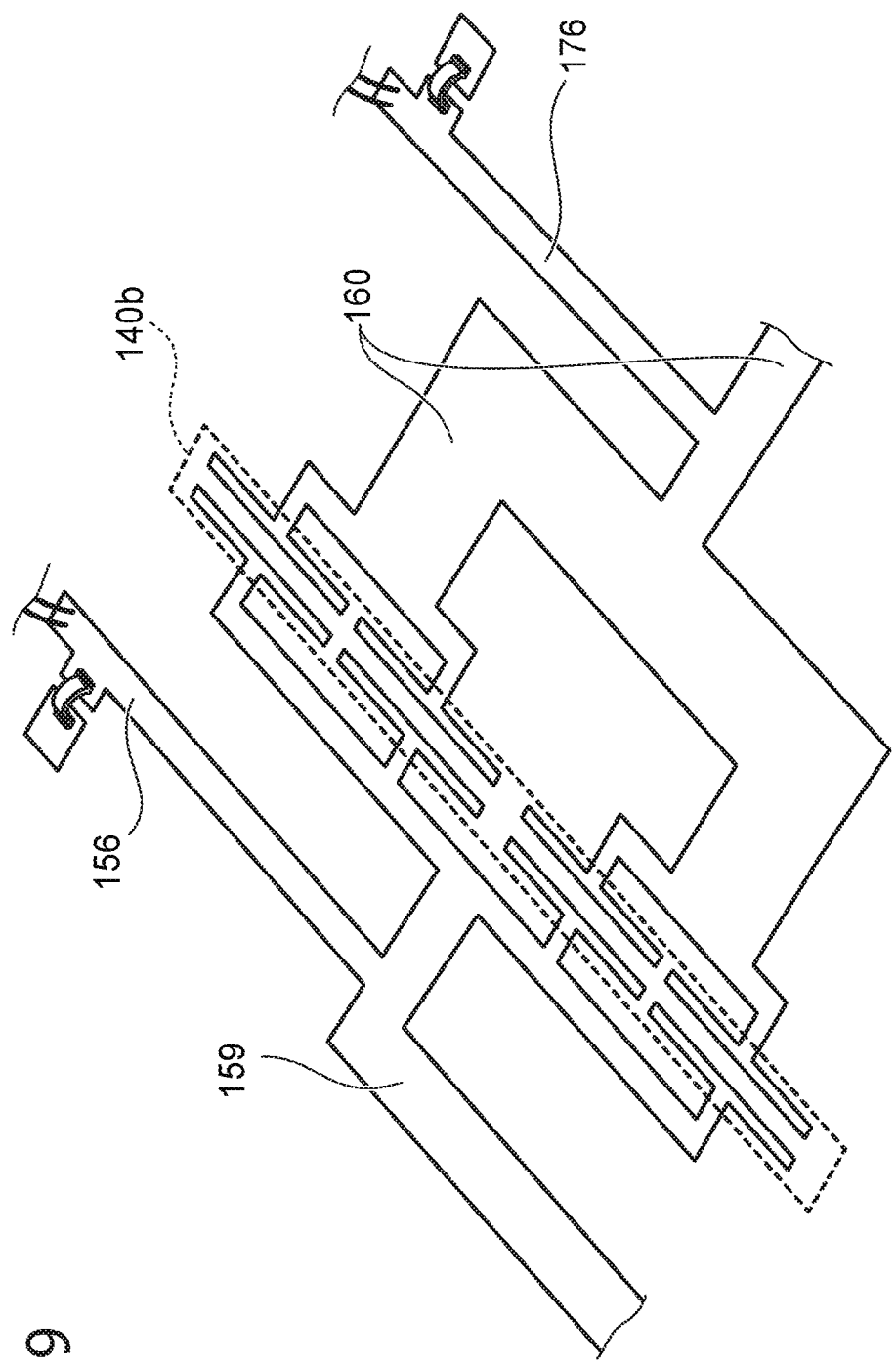
FIG. 9 is a partially enlarged schematic perspective view of a neighborhood of a second semiconductor element of the high frequency semiconductor amplifier according to the comparative example.

FIG. 9 is a partially enlarged schematic perspective view of a neighborhood of a second semiconductor element of the high frequency semiconductor amplifier according to the comparative example.

The high frequency semiconductor amplifier includes a metal plate 110, an MMIC chip 140, and a frame part 180 made of insulator. The MMIC chip 140 includes an input circuit 120, a first semiconductor element 140a, an interstage circuit 150, a second semiconductor element 140b, and an output circuit 170.

The input circuit 120 includes a first DC blocking capacitor 127, an input transmission line 122 having two regions connected to the respective ends of the first DC blocking capacitor 127, and a first bias circuit 126.

The interstage circuit 150 includes a second DC blocking capacitor 157, an interstage transmission line 158 having two regions connected to the respective ends of the second DC blocking capacitor 157, a second bias circuit 153, a microstrip line divider 159 connected to the interstage transmission line 158, and a third bias circuit 156.

The output circuit 170 includes a microstrip line combiner 160, a third DC blocking capacitor 178, an output transmission line 172 connected to the output end of the microstrip line combiner 160 and having regions connected to the respective ends of the third DC blocking capacitor 178, and a fourth bias circuit 176.

The first semiconductor element 140a and the second semiconductor element 140b (the region shown by the dashed line) include a nitride-based semiconductor layer.

The first semiconductor element 140a, the second semiconductor element 140b, the input circuit 120, the interstage circuit 150, and the output circuit 170 are formed on the nitride-based semiconductor layer stacked on a SiC substrate.

In the process for forming a dielectric thin film including Si oxide film or Si nitride film on the nitride-based semiconductor layer (such as AlGaN/GaN stacked layer), it is difficult to keep its breakdown voltage stably at 100 V or more. In a nitride-based semiconductor element requiring a breakdown voltage higher than 100 V, capacitors need to be externally attached to the external circuit of the MMIC. This increases the number of parts and complicates the assembly process. Thus, the high frequency semiconductor amplifier is made expensive.

In contrast, according to this embodiment, the silicon manufacturing process is used to form a Si oxide film or Si nitride film on a Si substrate. The breakdown voltage of such a Si oxide film and Si nitride film can be stably set to 100 V or more. This enables operation of a field effect transistor at a voltage higher than 50 V. Thus, higher output power can be achieved.

Furthermore, a wafer including nitride-based semiconductor formed on a SiC or diamond substrate is expensive, and its diameter is difficult to enlarge. On the other hand, an MMIC has a large chip size. Thus, the yield per wafer is made lower. As a result, the MMIC chip according to the comparative example is made more expensive, and the high frequency semiconductor amplifier based thereon is also made expensive. If a nitride-based semiconductor layer is formed on a Si substrate, the diameter of the wafer can be enlarged. However, the Si substrate has lower heat dissipation performance than the SiC substrate or diamond substrate. Undesirably, this degrades the characteristics and reliability of the semiconductor element.

In contrast, according to this embodiment, the size of the first semiconductor element 40 and the second semiconductor elements 41, 42 is sufficiently smaller than the chip size of the MMIC. Thus, the yield per wafer is high. Accordingly, the cost of the semiconductor element chip can be relatively lowered even using an expensive wafer. Furthermore, in the circuit formed on a Si substrate using the Si volume production process, the capacitor has high breakdown voltage. This can improve the reliability. Furthermore, high volume productivity can reduce the cost of the high frequency semiconductor amplifier.

The semiconductor element is made of nitride-based semiconductor formed on a SiC or diamond substrate, and the circuit is formed on Si. This can realize low cost, high output power, and high heat dissipation. Alternatively, the semiconductor element is made of nitride-based semiconductor formed on a thin-layer Si substrate, and the circuit is formed on Si. This can also realize low cost, high output power, and high heat dissipation.

Figure 10:
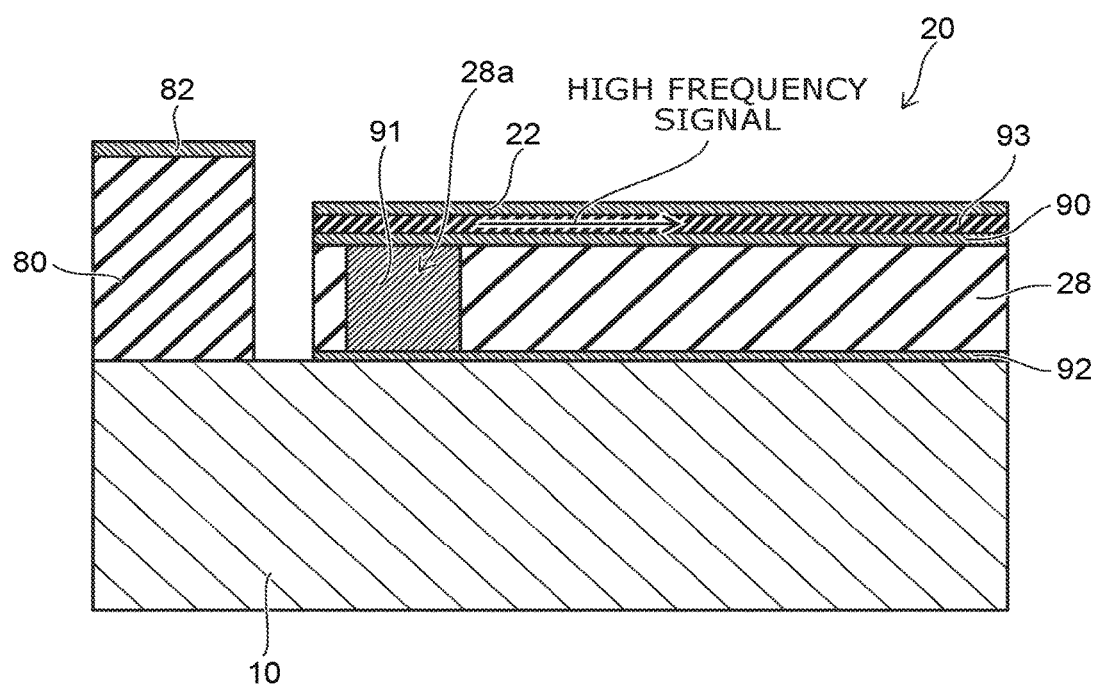
FIG. 10 is a schematic sectional view showing a variation of the transmission line.

FIG. 10 is a schematic sectional view showing a variation of the transmission line.

The dielectric loss of Si oxide film or Si nitride film is lower than the dielectric loss of Si. In the case where the transmission line is a microstrip line, the dielectric layer made of Si oxide film or Si nitride film can reduce dielectric loss at a frequency of 10 GHz or more.

For instance, as shown in FIG. 10, a conductive layer 90 as a grounded conductor is provided on a Si substrate 28. A second dielectric layer 93 made of Si oxide film or Si nitride film is provided on the conductive layer 90. An upper conductive layer is formed on the surface of the second dielectric layer 93 and constitutes e.g. a transmission line 22.

A through hole 28a is provided in the Si substrate 28. A conductive layer 91 is provided in the through hole 28a and used for grounding to a back side conductor 92 provided on the Si substrate 28. A high frequency signal from an input terminal 82 propagates in the second dielectric layer 93 having low dielectric loss. As a result, the power loss is reduced.

The first to third embodiments and the variations associated therewith provide a high frequency semiconductor amplifier having high heat dissipation performance and volume productivity and low cost. This high frequency semiconductor amplifier can be widely used in radar devices and communication equipment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A high frequency semiconductor amplifier comprising:
    an input circuit provided on a Si substrate and including a first DC blocking capacitor, an input transmission line having two regions connected to respective ends of the first DC blocking capacitor, a first input pad part connected to the input transmission line, and a first bias circuit;
    a first semiconductor element including a nitride-based semiconductor layer;
    first bonding wires connecting the first input pad part and the first semiconductor element;
    an interstage circuit provided on the Si substrate and including a second DC blocking capacitor, an interstage transmission line having two regions connected to respective ends of the second DC blocking capacitor, a first output pad part connected to the interstage transmission line, and a second bias circuit, a microstrip line divider connected to the interstage transmission line, a third bias circuit, and a second input pad part connected to the microstrip line divider;
    second bonding wires connecting the first semiconductor element and the output pad part;
    a second semiconductor element including a nitride-based semiconductor layer;
    third bonding wires connecting the second input pad part and the second semiconductor element;
    an output circuit provided on the Si substrate and including a second output pad part, a microstrip line combiner connected to the second output pad part, a third DC blocking capacitor, an output transmission line connected to an output end of the microstrip line combiner and having two regions connected to respective ends of the third DC blocking capacitor, and a fourth bias circuit;
    fourth bonding wires connecting the second output pad part and the second semiconductor element; and
    a package to which the first and second semiconductor elements and the Si substrate are bonded,
    the first and second semiconductor elements being each placed in a through hole provided in the Si substrate,
    the first bias circuit including a first grounded capacitor and a first transmission line connected to the first grounded capacitor and a region of the input transmission line between the input pad part and the first DC blocking capacitor,
    the second bias circuit including a second grounded capacitor and a second transmission line connected to the second grounded capacitor and a region of the interstage transmission line between the output pad part and the second DC blocking capacitor,
    the third bias circuit including a third grounded capacitor and a third transmission line connected to the microstrip line divider and the third grounded capacitor,
    the fourth bias circuit including a fourth grounded capacitor and a fourth transmission line connected to the microstrip line combiner and the fourth grounded capacitor,
    the first to fourth grounded capacitors and the first to third DC blocking capacitors having a first dielectric layer including Si oxide film or Si nitride film and sandwiched between upper and lower metal films, and
    the first to fourth grounded capacitors and the first to third DC blocking capacitors being provided on a surface of the Si substrate.

2. The amplifier according to claim 1, wherein the first to fourth transmission lines each have an electrical length of 81° or more and 99° or less.

3. The amplifier according to claim 2, wherein the input transmission line, the interstage transmission line, the output transmission line, and the first to fourth transmission lines are made of a second dielectric layer including Si oxide film or Si nitride film provided on a metal film of the Si substrate.

4. The amplifier according to claim 1, wherein the input transmission line, the interstage transmission line, the output transmission line, and the first to fourth transmission lines are made of a second dielectric layer including Si oxide film or Si nitride film provided on a metal film of the Si substrate.

5. A high frequency semiconductor amplifier comprising:
    an input circuit provided on a Si substrate and including a first DC blocking capacitor, an input transmission line having two regions connected to respective ends of the first DC blocking capacitor, a first input pad part connected to the input transmission line, and a first bias circuit;
    a first semiconductor element including a nitride-based semiconductor layer;
    first bonding wires connecting the first input pad part and the first semiconductor element;
    an interstage circuit provided on the Si substrate and including a second DC blocking capacitor, an interstage transmission line having two regions connected to respective ends of the second DC blocking capacitor, a first output pad part connected to the interstage transmission line, and a second bias circuit, a microstrip line divider connected to the interstage transmission line, a third bias circuit, and a second input pad part connected to the microstrip line divider;
    second bonding wires connecting the first semiconductor element and the output pad part;
    a second semiconductor element including a nitride-based semiconductor layer;
    third bonding wires connecting the second input pad part and the second semiconductor element;
    an output circuit provided on the Si substrate and including a second output pad part, a microstrip line combiner connected to the second output pad part, a third DC blocking capacitor, an output transmission line connected to an output end of the microstrip line combiner and having two regions connected to respective ends of the third DC blocking capacitor, and a fourth bias circuit;

fourth bonding wires connecting the second output pad part and the second semiconductor element; and a package to which the first and second semiconductor elements and the Si substrate are bonded, the first bias circuit including a first grounded capacitor and a first transmission line connected to the first grounded capacitor and a region of the input transmission line between the input pad part and the first DC blocking capacitor, the second bias circuit including a second grounded capacitor and a second transmission line connected to the second grounded capacitor and a region of the interstage transmission line between the output pad part and the second DC blocking capacitor, the third bias circuit including a third grounded capacitor and a third transmission line connected to the microstrip line divider and the third grounded capacitor, the fourth bias circuit including a fourth grounded capacitor and a fourth transmission line connected to the microstrip line combiner and the fourth grounded capacitor, the first to fourth grounded capacitors and the first to third DC blocking capacitors having a first dielectric layer including Si oxide film or Si nitride film and sandwiched between upper and lower metal films, the first to fourth grounded capacitors and the first to third DC blocking capacitors being provided on a surface of the Si substrate, the nitride-based semiconductor layer of the first semiconductor element being provided on a SiC substrate or a diamond substrate, the nitride-based semiconductor layer of the second semiconductor element being provided on a SiC substrate or a diamond substrate, and the first and second semiconductor elements being each placed in a through hole provided in the Si substrate.

6. The amplifier according to claim 5, wherein the first to fourth transmission lines each have an electrical length of 81° or more and 99° or less.

7. The amplifier according to claim 6, wherein the input transmission line, the interstage transmission line, the output transmission line, and the first to fourth transmission lines are made of a second dielectric layer including Si oxide film or Si nitride film provided on a metal film of the Si substrate.

8. The amplifier according to claim 5, wherein the input transmission line, the interstage transmission line, the output transmission line, and the first to fourth transmission lines are made of a second dielectric layer including Si oxide film or Si nitride film provided on a metal film of the Si substrate.

* * * * *